United States Patent
Lynam

(10) Patent No.: US 7,910,839 B2
(45) Date of Patent: Mar. 22, 2011

(54) ELECTRO-CONDUCTIVE CONTACT STRUCTURE FOR ENCLOSURE SEALING IN HOUSINGS

(75) Inventor: Jeff Ronald Lynam, Roanoke, VA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 78 days.

(21) Appl. No.: 12/323,781

(22) Filed: Nov. 26, 2008

(65) Prior Publication Data

US 2010/0126766 A1   May 27, 2010

(51) Int. Cl.
*H05K 9/00* (2006.01)

(52) U.S. Cl. ................. 174/369; 174/384

(58) Field of Classification Search .......... 174/369, 174/382, 384; 361/816, 818
See application file for complete search history.

(56) References Cited

U.S. PATENT DOCUMENTS

| | | | | |
|---|---|---|---|---|
| 4,567,318 A * | 1/1986 | Shu | | 174/372 |
| 4,759,466 A * | 7/1988 | Chase et al. | | 220/4.02 |
| 5,001,298 A * | 3/1991 | Jong | | 174/372 |
| 5,095,177 A * | 3/1992 | Johnson | | 174/372 |
| 6,348,654 B1 * | 2/2002 | Zhang et al. | | 174/362 |
| 6,549,426 B1 * | 4/2003 | Lawlyes et al. | | 361/816 |
| 6,613,977 B1 * | 9/2003 | Fowler | | 174/382 |
| 6,919,505 B2 * | 7/2005 | Cox | | 174/382 |
| 7,342,184 B2 * | 3/2008 | Cochrane | | 174/367 |
| 7,504,592 B1 * | 3/2009 | Crotty, Jr. | | 174/372 |
| 7,687,725 B2 * | 3/2010 | Hogan | | 174/367 |
| 2002/0185292 A1 * | 12/2002 | Ariel | | 174/350 |
| 2005/0121216 A1 | 6/2005 | Cox | | |
| 2006/0096773 A1 | 5/2006 | Cochrane | | |
| 2008/0310086 A1 * | 12/2008 | Akama et al. | | 361/679 |

OTHER PUBLICATIONS

"*Shark Tooth Lap Joint For Electromagnetic Compatibility Boundaries*"; IBM Technical Disclosure Bulletin, US, vol. 38, No. 11, Nov. 1, 1995; p. 523, XP000547444; ISSN: 0018-8689 (entire document).
PCT International Search Report For International Application No. PCT/US2009/057786; Search Report Completed Dec. 8, 2009 and Mailed Dec. 16, 2009.

* cited by examiner

*Primary Examiner* — Hung V Ngo
(74) *Attorney, Agent, or Firm* — RatnerPrestia

(57) ABSTRACT

An electro-conductive contact structure for sealing the interior of an enclosure from interference includes first and second electro-conductive contact surfaces. In one embodiment, the first electro-conductive contact surface includes a plurality of projections, and the second electro-conductive contact surface includes a plurality of slots. The projections are configured for insertion into the slots to form an electro-conductive interface between the first and second portions of the enclosure. In another embodiment, the electro-conductive contact structures are formed on first and second housing parts, respectively. In another embodiment, the electro-conductive contact surfaces each include a series of fingers and a plurality of pockets between the fingers.

19 Claims, 3 Drawing Sheets

ELECTRO-CONDUCTIVE CONTACT STRUCTURE FOR ENCLOSURE SEALING IN HOUSINGS

FIELD OF THE INVENTION

The present invention relates generally to housings, and more specifically to electro-conductive contact structures that are integrated into housings.

BACKGROUND

Various housing are used to protect electronic equipment from environmental conditions and disruptions caused by electromagnetic interference (EMI) or radio frequency interference (RFI). The housings typically have two or more housing parts that are joined together to create an enclosure. Seams or gaps between the housing parts can allow EMI and RFI to penetrate the housing. To prevent EMI and RFI, many housings have some form of compliant gasket or bridge connector connected across the gap or seam between the housing parts. The gasket or bridge, which is often a stocked part, facilitates electrical contact between the housing parts. Beryllium-copper finger stock gaskets are a common type of EMI shielding gasket.

Compliant gaskets and bridge connectors can create many problems. For example, elastomeric gaskets shrink and lose their integrity over time. When gaskets shrink, gaps form between the housing surfaces and increase in size, increasing the potential for EMI and RFI. Gaskets and bridge connectors also make assembly more complicated, and affect the positioning and design of environmental gaskets and other elements that need to be included on the housing parts.

Finger stock gaskets are typically manufactured with tolerances that permit small gaps between the fingers. Although the gaps are relatively small, and are assumed to be insignificant, the gaps are still problematic for many applications.

SUMMARY OF THE INVENTION

Electro-conductive contact structures and housings in accordance with the invention resolve many of the drawbacks found in conventional EMI and RFI shielding. In accordance with a first aspect of the invention, an electro-conductive contact structure for sealing the interior of an enclosure from interference includes first and second electro-conductive contact surfaces. The first electro-conductive contact surface includes a plurality of projections, and the second electro-conductive contact surface includes a plurality of slots. The projections are configured for insertion into the slots to form an electro-conductive interface between the first and second portions of the enclosure.

In accordance with a second aspect of the invention, an enclosure for sealing an interior space from interference includes first and second housing parts. The first housing part includes a plurality of projections that form a first electro-conductive contact surface. The second housing part includes a plurality of slots that form a second electro-conductive contact surface. The projections on the first housing part are configured for insertion into the slots of the second housing part to form an electro-conductive interface between the first and second housing parts. The electro-conductive interface seals the interior space from interference.

In accordance with a third aspect of the invention, an electro-conductive contact structure for sealing the interior of an enclosure from interference includes first and second electro-conductive contact surfaces. The first electro-conductive contact is surface includes a series of first fingers and plurality of pockets between the first fingers. The second electro-conductive contact surface includes a series of second fingers and a plurality of pockets between the second fingers. The first fingers are sized and arranged to fit in the pockets between the second fingers, and the second fingers are sized and arranged to fit in the pockets between the first fingers, so as to seal the interior of the enclosure from interference.

BRIEF DESCRIPTION OF THE DRAWINGS

The foregoing summary and the following description will be better understood when reviewed with the drawing figures, of which.

DETAILED DESCRIPTION OF PREFERRED EMBODIMENTS OF THE INVENTION

Although the invention is illustrated and described herein with reference to specific embodiments, the invention is not intended to be limited to the details shown. Various modifications may be made in the details within the scope and range of equivalents of the claims and without departing from the invention.

Housings in accordance with the invention resolve many of the drawbacks associated with conventional EMI and RFI shielding techniques. In preferred embodiments, the housings have an interleaved electro-conductive contact structure integrated in the housing. The contact structure is integrated in the design of the housing during manufacturing, such as by molding or machining the contact structure with the housing part. By integrating the contact structure into the design of the housing, there is complete freedom to design the contact structure when the housing is designed. The contact structure can be designed with configuration that is optimized to shield specific electromagnetic waves.

The integration of customized contact structures into a housing is a significant departure from conventional approaches to EMI and RFI shielding. Conventional approaches to EMI and RFI shielding assume a "one configuration fits all" approach that suggests that stock gaskets and bridges can be universally used in all environments. In contrast to this industry practice, the present invention provides integrated custom designs that are configured to address specific EMI conditions. Manufacturers of housings have complete control over the design, and can ensure a void-free contact structure. The integrated contact structures also conserve space, and simplify the assembly process.

Conventional EMI and RFI shields like finger gaskets rely on an elastic spring force in the fingers. The fingers must be biased into contact with both housing parts to maintain an electro-conductive bridge between the two housing parts. To allow the fingers to flex, the fingers have gaps or voids around them. If these gaps and voids are not carefully controlled, they can permit EMI and RFI inside the enclosure. Interleaved contact structures in accordance with the invention move away from the idea of having elastic fingers surrounded by gaps and voids. Instead, the interleaved contact structures are meshed in a tightly sealed, void-free manner. There is no need to provide gaps or voids because the contact structures of the present invention do not rely on a spring bias to maintain electro-conductive contact between housing parts.

Figure 1:
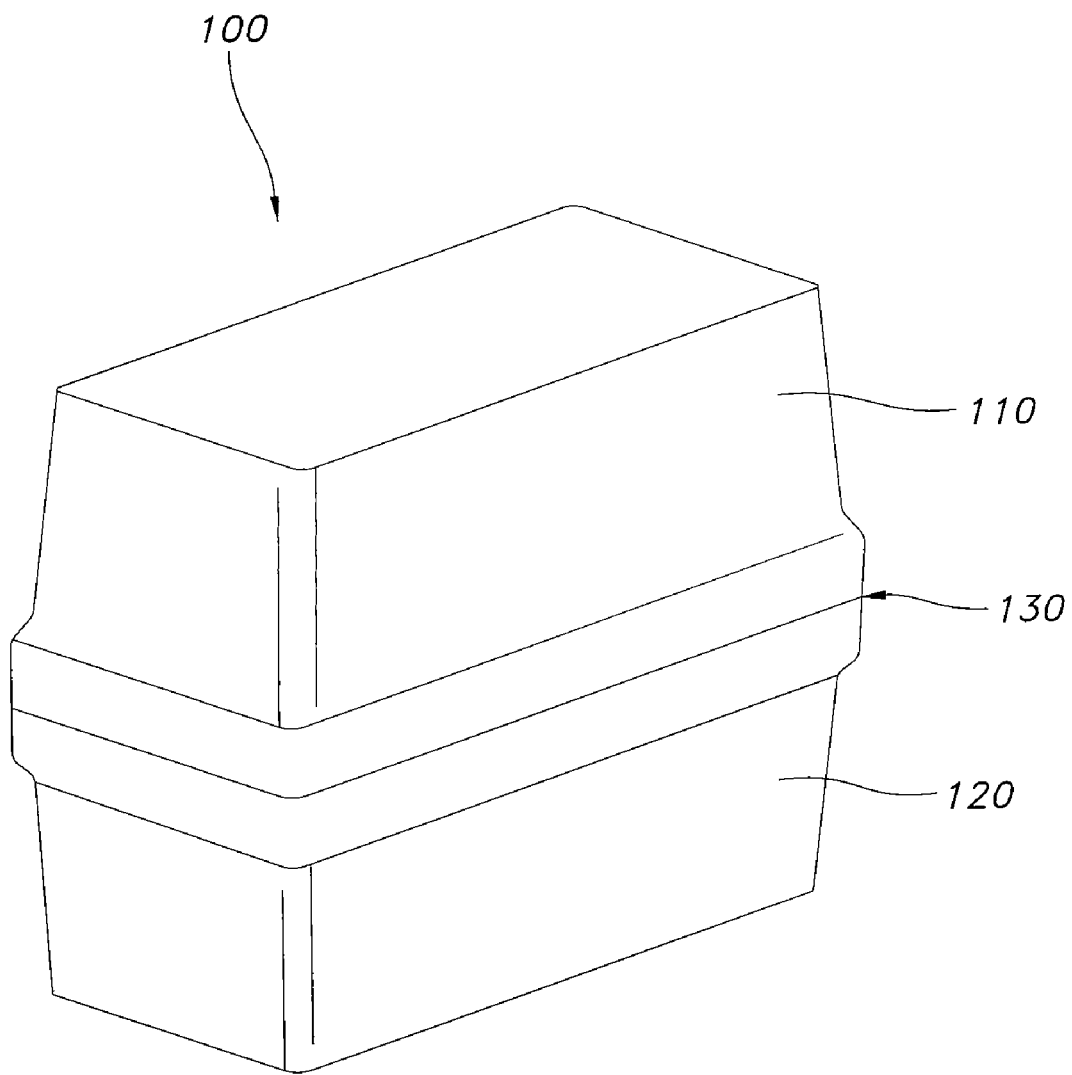
FIG. 1 is a perspective view of a housing in accordance with one exemplary embodiment of the invention, showing the housing in a sealed condition.
Figure 2:
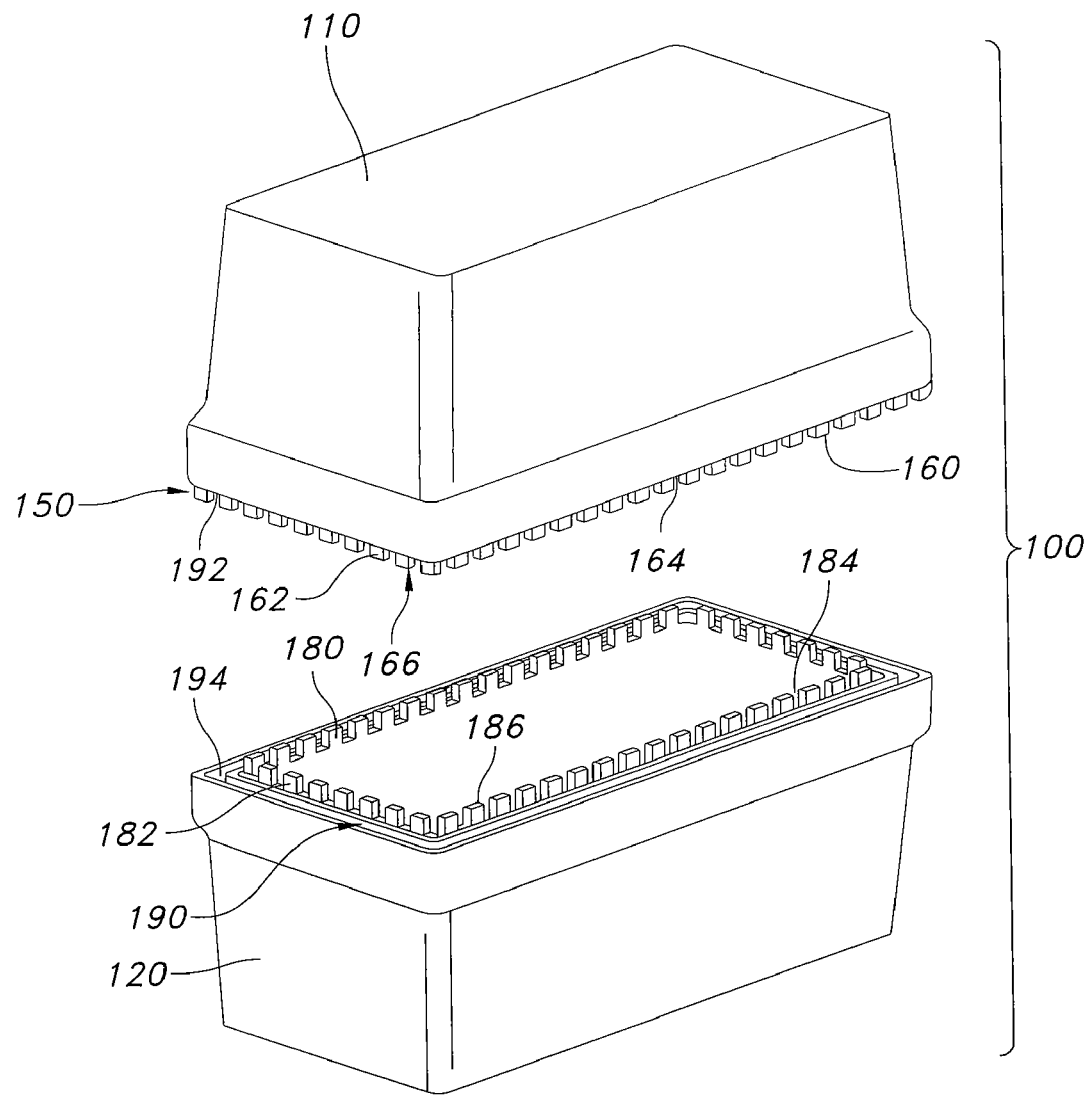
FIG. 2 is a perspective view of the housing of FIG. 1, showing the housing in an unsealed condition.

Referring to the drawing figures generally, and to FIGS. 1 and 2 in particular, a housing 100 for enclosing electronic components is shown in accordance with one embodiment of the present invention. Housing 100 includes a top portion 110 and a bottom portion 120 that joins with the top portion at an interface 130 to form an enclosure. Top and bottom portions 110 and 120 are shown in a closed or sealed condition in FIG. 1, forming a sealed enclosure around an interior space. In contrast, top and bottom portions 110 and 120 are shown in an open or unsealed condition in FIG. 2. Interface 130 includes an electro-conductive contact structure 150. The electro-conductive contact structure 150 provides intimate contact between the top and bottom portions 110 and 120 for sealing the interior of the housing from EMI and RFI when the housing parts are sealed together as shown in FIG. 1.

Unlike conventional enclosures and housings with standard compliant gaskets and bridge connectors, housing 100 physically integrates an electro-conductive contact structure 150 into the housing parts 110 and 120. With this arrangement, a separate electro-conductive contact structure is not needed, and does not have to be added during assembly. Physical incorporation of the electro-conductive contact structure in the housing parts 110 and 120 simplifies the manufacturing process.

Electro-conductive structure 150 has a first electro-conductive contact surface 160 and a second electro-conductive contact surface 180. First and second electro-conductive contact surfaces 160, 180 are "interleaved" with one another to provide intimate electro-conductive contact between the sealed housing parts 110 and 120. First electro-conduct surface 160 is integrated into top portion 110 of housing 100. Second electro-conductive surface 180 is integrated into bottom portion 120 of housing 100. First electro-conductive surface 160 has a series of projections or fingers 162 that extend toward bottom housing part 120 when the housing parts are aligned with one another, as shown in FIGS. 2. Second electro-conductive surface 180 includes a series of similar projections or fingers 182 that extend toward top housing part 110 when the housing parts are aligned. Fingers 162 are separated from one another by a series of pockets or slots 164. Similarly, fingers 182 are separated from one another by a similar series of pockets or slots 184. Slots 164 are sized and arranged to receive fingers 182, and slots 184 are similarly sized and arranged to receive fingers 162.

Electro-conductive contact surfaces in accordance with the invention may have a variety of dimensions and geometries. Fingers 162 and 182, for example, are generally rectangular and have a uniform size, shape and thickness. Each of fingers 162 and 182 has a joined end that is connected with its respective housing part, and a free end that projects toward the other housing part when the housing parts are aligned as shown. The free ends of fingers 162 and 182 have squared corners 166 and 186, respectively.

Slots 184 have uniform shapes and sizes that are identical or substantially identical to the shapes and sizes of fingers 162. Moreover, slots 164 have uniform shapes and sizes that are identical or substantially identical to the shapes and sizes of fingers 182. Fingers 162 may have the same shape and size as fingers 182, or different shapes or sizes. It may be desirable to use different finger configurations on the two housing parts in cases where the housing parts have nearly identical shapes, symmetrical designs or other similar configurations that are difficult to distinguish. The different finger designs can serve as visible indicia to distinguish the two housing parts from one another. When different finger configurations are used on the housing parts, the slots 164, 184 can also have different configurations on the two housing parts to correspond and mesh with the different finger configurations in a void-free manner.

When top and bottom housing parts 110 and 120 are joined together, first and second electro-conductive contact surfaces 160 and 180 engage each other in a meshed arrangement. In the meshed arrangement, fingers 162 extend into slots 184 and fingers 182 extend into slots 164. Preferably, the perimeters of the fingers are in complete contact with the perimeters of the slots to form a completely closed and sealed interface between the housing parts with no voids.

Housing 100 includes a cavity 190 that surrounds the perimeter of the housing at interface 150. Cavity 190 is sized and arranged to receive an additional protective element, such as an environmental gasket. Top housing part 110 includes a first channel 192 disposed outwardly from contact surface 160. Similarly, bottom housing part 120 includes a second channel 194 disposed outwardly from contact surface 180. First and second channels 192 and 194 are offset outwardly from contact surfaces 160 and 180, respectively. When top and bottom housing parts 110 and 120 are connected together in the closed condition, first and second channels 192 and 194 align with one another to form cavity 190, which is enclosed.

Housings and electro-conductive contact structures in accordance with the invention need not have the specific shapes and configurations shown in FIGS. 1 and 2. Rather, the housings and contact surfaces in accordance with the invention can be custom designed based on the properties of electromagnetic waves that are present where the housing is to be installed. A variety of finger configurations may be used in accordance with the invention, and the contact surfaces are not limited to the finger configurations shown in the drawing figures. For example, fingers may be trapezoidal, semi-circular, triangular or have other profiles and shapes.

Figure 3:
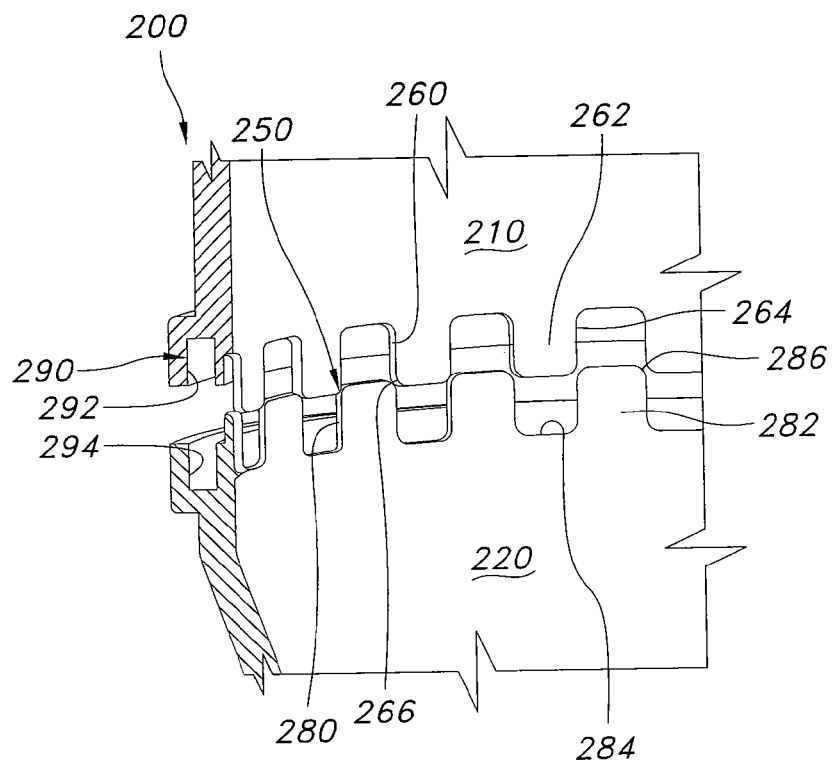
FIG. 3 is an enlarged interior truncated view of a housing in accordance with another exemplary embodiment of the invention, showing the housing in an unsealed condition.
Figure 4:
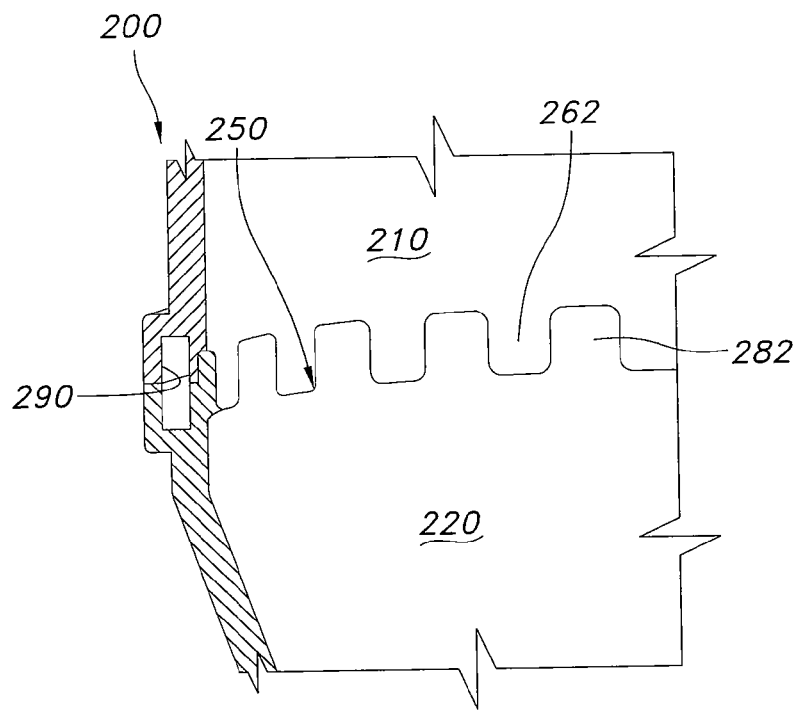
FIG. 4 is an enlarged interior truncated view of the housing of FIG. 3, showing the housing in a sealed condition.

Referring now to FIGS. 3 and 4, an alternative contact structure 250 is shown in accordance with the present invention on a pair of housing parts 210 and 220. FIGS. 3 and 4 are enlarged and truncated to better illustrate the electro-conductive contact surfaces on each housing part. Housing part 210 is a top housing part, and housing part 220 is a bottom housing part that mates with top housing part to form an enclosure 200. Enclosure 200 has many of the same features shown in FIGS. 1 and 2. Therefore, features of enclosure 200 that are identical to features of enclosure 100 will not be described, with the understanding that they share the same characteristics as described above.

Electro-conductive contact structure 250 has a first electro-conductive contact surface 260 and a second electro-conductive contact surface 280. First and second contact surfaces 260, 280 are "interleaved" with one another to provide intimate electro-conductive contact between the sealed housing parts 210 and 220. First electro-conductive contact surface 260 is integrated into top housing portion 210, and second electro-conductive contact surface 280 is integrated into bottom housing portion 220. First electro-conductive surface 260 has a series of projections or fingers 262 that extend toward bottom housing part 220 when the housing parts are aligned with one another. Similarly, second electro-conductive surface 280 includes a series of projections or fingers 282 that extend toward top housing part 210 when the housing parts are aligned. Fingers 262 are separated from one another by a series of receivers or slots 264. Similarly, fingers 282 are separated from one another by a similar series of receivers or slots 284. Slots 264 are sized and arranged to receive fingers 282, and slots 284 are sized and arranged to receive fingers 262.

Each of fingers 262 and 282 has a joined end that is connected with its respective housing part, and a free end that projects toward the other housing part when the housing parts are aligned as shown. The free ends of fingers 262 and 282 have rounded corners 266 and 286, respectively. Slots 284 have uniform shapes and sizes that are identical or substantially identical to the shapes and sizes of fingers 262. Moreover, slots 264 have uniform shapes and sizes that are identical or substantially identical to the shapes and sizes of fingers 282.

When top and bottom housing parts 210 and 220 are joined together, first and second electro-conductive contact surfaces 260 and 280 engage each other in a meshed arrangement with fingers 262 extending in slots 284 and fingers 282 extending in slots 264. Preferably, the perimeters of the fingers and slots are in complete contact with one another to form a completely closed and sealed interface between the housing parts. The rounded contours of fingers 260 and 280 allow the fingers to slide and adjust laterally in the event that fingers on one housing part are not perfectly aligned with opposing slots on the other housing part when the parts are being closed. In this configuration, the rounded corners 266 and 286 assist in guiding the fingers 262 and 282 into opposing slots so that the housing parts can close properly. As with housing 100, fingers 262 and 282 on housing 200 are integrally formed and homogeneous with their respective housing parts.

The electro-conductive contact surfaces 260 and 280 have a narrow cross-section and profile, providing room for other elements to be incorporated into the housing parts near the contact surfaces. Housing 200 includes a cavity 290 that surrounds the perimeter of the housing at the interface 250. Cavity 290 is sized and arranged to receive an additional protective element, such as an environmental gasket. Top housing part 210 includes a first channel 292 disposed outwardly from contact surface 260. Similarly, bottom housing part 220 includes a second channel 294 disposed outwardly from contact surface 280. First and second channels 292 and 294 are offset outwardly from contact surfaces 260 and 280, respectively.

Housing parts and contact surfaces in accordance with the invention may be formed of a variety of materials including conductive metals, plastics or blends thereof. For example, top and bottom housing parts in accordance with the invention may be formed of aluminum, zinc, magnesium or other conductive metal. Alternatively, the top and bottom parts may be made of a plastic. Moreover, the top and bottom housing parts may include a base material of aluminum, zinc or magnesium, and a coating of copper, nickel, zinc or other material having a low resistivity. The electro-conductive contact surfaces may be formed of copper or zinc. Fingers may be formed of copper, zinc or other material having a low resistivity. Preferably, an electro-conductive coating is applied uniformly over all fingers and slots to ensure uniform connectivity between all fingers and slots. The individual fingers may be dimensioned so as to guarantee physical contact between all of the mating fingers, with no gaps or voids between first and second contact surfaces.

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

What is claimed is:

1. An enclosure for sealing an interior space from interference, the enclosure comprising:
    a first housing part having a perimeter and a plurality of projections extending around the entire perimeter of the first housing part, the projections forming a first electro-conductive contact surface;
    a second housing part having a perimeter and a plurality of slots extending around the entire perimeter of the second housing part, the slots forming a second electro-conductive contact surface,
    the first housing part comprising a first channel wall disposed outwardly from the projections;
    the second housing part comprising a second channel wall disposed outwardly from the slots;
    the projections on the first housing part configured for insertion into the slots of the second housing part to form an electro-conductive interface between the first and second housing parts of the enclosure that seals the interior space from interference, the first and second channel walls overlapping the projections and slots.

2. The enclosure of claim 1, wherein the plurality of projections of the first housing part are of uniform shape and uniformly spaced around the entire first perimeter; and
    the plurality of slots of the second housing part are of uniform shape and uniformly spaced around the entire second perimeter,
    the projections configured for insertion into the slots to form an electro-conductive interface between the first and second portions of the enclosure.

3. The enclosure of claim 1, wherein each projection comprises a perimeter and each slot has a perimeter, the perimeters of the projections configured to engage the perimeters of the slots in complete contact to form a closed and void-free interface.

4. The enclosure of claim 1, wherein the shape of the projections is rectangular.

5. The enclosure of claim 1, wherein the projections comprise a conductive metal material or a plastic.

6. The enclosure of claim 5, wherein the projections are coated with a conductive metal material.

7. The enclosure of claim 1, wherein the projections all have the same perimeter shape, and the slots all have the same perimeter shape, the perimeter shape of the projections and the perimeter shape of the slots being substantially identical.

8. The enclosure of claim 7, wherein the perimeter shape of the projections is rectangular.

9. The enclosure of claim 1, wherein the projections comprise a conductive metal material or a plastic.

10. The enclosure of claim 9, wherein the projections are coated with a conductive metal material.

11. The enclosure of claim 1, wherein the first electro-conductive contact surface is machined onto the first housing part.

12. The enclosure of claim 1, wherein the second electro-conductive contact surface is machined onto the second housing part.

13. The enclosure of claim 1, wherein the first electro-conductive contact surface is molded with the first housing part.

14. The enclosure of claim 1, wherein the second electro-conductive contact surface is molded with the second housing part.

15. The enclosure of claim 1, wherein the first and second housing parts of the enclosure are formed of aluminum, zinc or magnesium.

16. The enclosure of claim 1, wherein the first and second housing parts of the enclosure comprise a base material of aluminum, zinc or magnesium, and a coating material of copper or zinc.

17. The enclosure of claim 1, wherein the first electro-conductive contact surface engages the entire second electro-conductive contact surface.

18. An electro-conductive contact structure for sealing the interior of an enclosure from interference, the contact structure comprising:
   a first electro-conductive contact surface having a perimeter and comprising a series of first fingers and plurality of pockets between the first fingers, the first fingers having a uniform shape and being evenly spaced around the entire perimeter of the first electro-conductive contact surface, the first electro-conductive contact surface comprising a first channel wall positioned outwardly from and partially overlapping the first fingers;
   a second electro-conductive contact surface having a perimeter and comprising a series of second fingers and a plurality of pockets between the second fingers, the second fingers having a uniform shape and being evenly spaced around the entire perimeter of the second electro-conductive contact surface, the second electro-conductive contact surface comprising a second channel wall positioned outwardly from and partially overlapping the second fingers;
   the first fingers being sized and arranged to fit in the pockets between the second fingers, and the second fingers being sized and arranged to fit in the pockets between the first fingers to seal the interior of the enclosure from interference.

19. The electro-conductive contact structure of claim 18, wherein the first electro-conductive contact surface engages the entire second electro-conductive contact surface.

* * * * *